US009197807B2

(12) United States Patent
Hamada

(10) Patent No.: US 9,197,807 B2
(45) Date of Patent: Nov. 24, 2015

(54) IMAGING DEVICE INCLUDING PHASE DETECTION PIXELS ARRANGED TO PERFORM CAPTURING AND TO DETECT PHASE DIFFERENCE

(75) Inventor: Masataka Hamada, Suwon-si (KR)

(73) Assignee: SAMSUNG ELECTRONICS CO., LTD., Suwon-Si (KR)

(*) Notice: Subject to any disclaimer, the term of this patent is extended or adjusted under 35 U.S.C. 154(b) by 583 days.

(21) Appl. No.: 13/441,146

(22) Filed: Apr. 6, 2012

(65) Prior Publication Data
US 2013/0088621 A1 Apr. 11, 2013

(30) Foreign Application Priority Data

Oct. 7, 2011 (KR) .................. 10-2011-0102658

(51) Int. Cl.
G03B 13/00 (2006.01)
H04N 5/232 (2006.01)
H04N 5/3745 (2011.01)
H04N 9/04 (2006.01)
H01L 27/146 (2006.01)
H04N 5/369 (2011.01)

(52) U.S. Cl.
CPC ...... H04N 5/23212 (2013.01); H01L 27/14603 (2013.01); H01L 27/14621 (2013.01); H01L 27/14623 (2013.01); H01L 27/14627 (2013.01); H01L 27/14641 (2013.01); H04N 5/3696 (2013.01); H04N 5/37457 (2013.01); H04N 9/045 (2013.01)

(58) Field of Classification Search
USPC ................. 348/308–310, 349–350
See application file for complete search history.

(56) References Cited

U.S. PATENT DOCUMENTS

| 6,829,008 | B1 | 12/2004 | Saga et al. |
| 7,652,713 | B2* | 1/2010 | Yamasaki ..................... 348/345 |
| 8,102,463 | B2* | 1/2012 | Komaba et al. ............... 348/349 |
| 8,264,579 | B2* | 9/2012 | Paik et al. ..................... 348/308 |
| 8,730,373 | B2* | 5/2014 | Egawa .......................... 348/345 |
| 8,754,976 | B2* | 6/2014 | Oikawa et al. ................ 348/345 |
| 8,842,214 | B2* | 9/2014 | Aoki et al. .................... 348/354 |
| 2010/0194967 | A1* | 8/2010 | Amano ......................... 348/345 |
| 2011/0109776 | A1* | 5/2011 | Kawai ........................... 348/273 |

FOREIGN PATENT DOCUMENTS

JP 2000-156823 A 6/2000

* cited by examiner

Primary Examiner — Ngoc-Yen Vu
(74) Attorney, Agent, or Firm — Drinker Biddle & Reath LLP

(57) ABSTRACT

An imaging device including phase difference detection pixels and, more particularly, an imaging device that comprises a plurality of pixels that are two-dimensionally arranged to capture an image and to detect phase difference, a first photoelectric conversion pixel row; and a second photoelectric conversion pixel row, wherein the first photoelectric conversion pixel row and the second photoelectric conversion pixel row are each disposed such that circuits formed in every pixel for phase difference detection are arranged opposite to each other with respect to an opening of a photoelectric conversion pixel. In the imaging device, phase difference detection may be performed with respect to entire photographed screen areas. In addition, the imaging device including phase difference detection pixels may have no defect pixels and thus improved image quality is obtained. Photographing and AF of a subject may be performed in low luminance.

15 Claims, 17 Drawing Sheets

FIG. 7

| R | G |
|---|---|
| G | B |

FIG. 8

| G | R | G | R | G | R | G | R |
|---|---|---|---|---|---|---|---|
| B | G | B | G | B | G | B | G |
| G | R | G | R | G | R | G | R |
| B | S1 | B | S1 | B | S1 | B | S1 |
| G | R | G | R | G | R | G | R |
| B | S2 | B | S2 | B | S2 | B | S2 |
| G | R | G | R | G | R | G | R |
| B | G | B | G | B | G | B | G |

BY1 (rows 1-2), PH1 (rows 3-4), PH2 (rows 5-6), BY2 (rows 7-8)

FIG. 9A
| RLa | GLa | RLa | GLa |
|-----|-----|-----|-----|
| GLa | BLa | GLa | BLa |
| RRa | GRa | RRa | GRa |
| GRa | BRa | GRa | BRa |
FIG. 9B
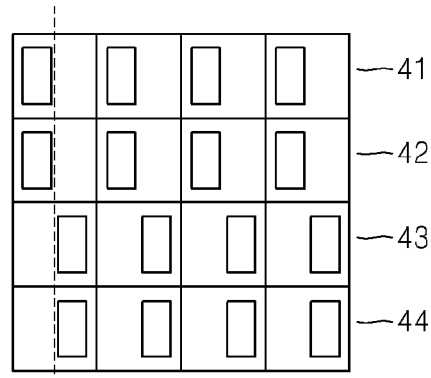
FIG. 10A
| RLa | GLa | RRa | GRa |
|-----|-----|-----|-----|
| GLa | BLa | GRa | BRa |
| RLa | GLa | RRa | GRa |
| GLa | BLa | GRa | BRa |
FIG. 10B
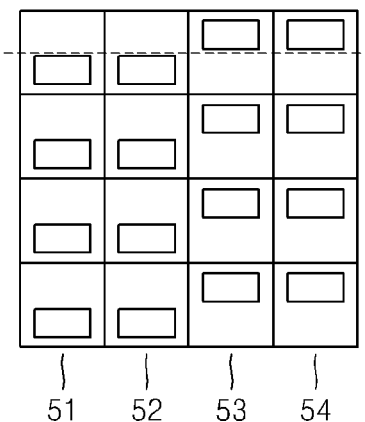

FIG. 21

IMAGING DEVICE INCLUDING PHASE DETECTION PIXELS ARRANGED TO PERFORM CAPTURING AND TO DETECT PHASE DIFFERENCE

CROSS-REFERENCE TO RELATED PATENT APPLICATION

This application claims the benefit of Korean Patent Application No. 10-2011-0102658, filed on Oct. 7, 2011, in the Korean Intellectual Property Office, the entire disclosure of which is incorporated herein in by reference.

BACKGROUND

1. Field of the Invention

The invention relates to an imaging device including phase difference detection pixels, and more particularly, to an imaging device including phase difference detection pixels arranged to detect phase difference and to capture images.

2. Description of the Related Art

Some image capturing devices use phase difference detection pixels to perform autofocus (AF). Phase difference detection works by adding phase difference detection pixels between imaging pixels. The signals output from the phase difference detection pixels are used to detect phase differences between signals generated by different phase difference detection pixels. The detected phase differences can be used to perform AF. Because the output of phase detection pixels may be different from the output of normal image capturing pixels, the phase difference detection pixels are often used only to detect phase differences and not to capture the image. This may reduce the quality of the captured image compared with an image captured from an image capturing device that does not use phase difference detection pixels.

Additionally, openings for phase difference detection pixels are small making it is difficult to perform AF in low luminance.

SUMMARY

Therefore, there is a need in the art for an imaging device that receives an image formed by an optical system and includes a plurality of pixels that are two-dimensionally arranged to perform capturing and detect phase difference, the imaging device including: a first photoelectric conversion pixel row; and a second photoelectric conversion pixel row, wherein the first photoelectric conversion pixel row and the second photoelectric conversion pixel row are each disposed such that circuits formed for each of a plurality of pixels for phase difference detection are arranged opposite to each other with respect to an opening of a photoelectric conversion pixel.

All pixels of the imaging device may output a signal for obtaining phase difference.

The first photoelectric conversion pixel row and the second photoelectric conversion pixel row each may include a transistor circuit formed in each of a plurality of photoelectric conversion pixels, wherein the plurality of photoelectric conversion pixels share an amplification circuit or a reset circuit in the transistor circuit.

The circuits formed for each of a plurality of pixels for phase difference detection may include at least one selected from the group consisting of a transmission circuit, a reset circuit, an amplification circuit, and a wiring circuit.

The first photoelectric conversion pixel row and the second photoelectric conversion pixel row may be each disposed such that a micro lens is formed on each of the plurality of photoelectric conversion pixels and an opening is formed between the micro lens and a photoelectric conversion unit, wherein the opening is eccentrically formed with respect to an optical axis of the micro lens, wherein the first photoelectric conversion pixel row and the second photoelectric conversion pixel row are in directions opposite to each other.

The first photoelectric conversion pixel row and the second photoelectric conversion pixel row may be each disposed such that a mask is formed in an area other than areas in which the plurality of photoelectric conversion pixels are formed.

Pixels constituting each of the first photoelectric conversion pixel row and the second photoelectric conversion pixel row may be formed of color filters, wherein the pixels are configured in a Bayer pattern to form Bayer pattern pixel units, wherein the Bayer pattern pixel units constitute each of the first photoelectric conversion pixel row and the second photoelectric conversion pixel row.

According to another aspect of the invention, there is provided an imaging device that receives an image formed by an optical system and includes a plurality of pixels that are two-dimensionally arranged to perform capturing and detect phase difference, the imaging device including: a first photoelectric conversion pixel row; and a second photoelectric conversion pixel row, wherein the first photoelectric conversion pixel row and the second photoelectric conversion pixel row are each disposed such that a circuit formed in every four pixels arranged in a Bayer pattern is positioned in a phase difference detection direction.

The first photoelectric conversion pixel row and the second photoelectric conversion pixel row may be each disposed such that a mask is formed in an area other than areas in which the plurality of photoelectric conversion pixels are formed.

According to another aspect of the invention, there is provided an imaging device that receives an image formed by an optical system and includes a plurality of pixels that are two-dimensionally arranged to perform capturing and detect phase difference, the imaging device including: a first photoelectric conversion pixel row; and a second photoelectric conversion pixel row, wherein the first photoelectric conversion pixel row and the second photoelectric conversion pixel row are each disposed such that circuits formed in every pixel for phase difference detection are arranged opposite to each other with respect to an opening of a photoelectric conversion pixel and a circuit formed in every four pixels arranged in a Bayer pattern is positioned in a phase difference detection direction.

The first photoelectric conversion pixel row and the second photoelectric conversion pixel row may be each disposed such that a mask is formed in an area other than areas in which the plurality of photoelectric conversion pixels are formed.

According to another aspect of the invention, there is provided an imaging device that receives an image formed by an optical system and includes a plurality of pixels that are two-dimensionally arranged to perform capturing and detect phase difference, the imaging device including: a first photoelectric conversion pixel row; and a second photoelectric conversion pixel row, wherein the first photoelectric conversion pixel row and the second photoelectric conversion pixel row are each disposed such that circuits formed in every pixel for phase difference detection are arranged opposite to each other with respect to an opening of a photoelectric conversion pixel and a plurality of the photoelectric conversion pixels share an amplification circuit or a reset circuit of a transistor circuit formed in each of the plurality of the photoelectric conversion pixel.

The first photoelectric conversion pixel row and the second photoelectric conversion pixel row may be each disposed such that a mask is formed in an area other than areas in which the plurality of photoelectric conversion pixels are formed.

According to another aspect of the invention, there is provided an imaging device that receives an image formed by an optical system and includes a plurality of pixels that are two-dimensionally arranged to perform capturing and detect phase difference, the imaging device including: a first photoelectric conversion pixel row; and a second photoelectric conversion pixel row, wherein the first photoelectric conversion pixel row and the second photoelectric conversion pixel row are each disposed such that circuits formed in every pixel for phase difference detection are arranged opposite to each other with respect to an opening of the pixel for phase difference detection and circuits formed in every pixel that does not perform phase difference detection are arranged in the same direction with respect to openings of the pixels.

The first photoelectric conversion pixel row and the second photoelectric conversion pixel row may be each disposed such that a micro lens is formed on each of the plurality of pixels, wherein an opening is formed between the micro lens and a photoelectric conversion unit, wherein the opening is eccentrically formed with respect to an optical axis of the micro lens, wherein the first photoelectric conversion pixel row and the second photoelectric conversion pixel row are in directions opposite to each other.

BRIEF DESCRIPTION OF THE DRAWINGS

The above and other features and advantages of the invention will become more apparent by describing in detail exemplary embodiments thereof with reference to the attached drawings in which:

FIG. 7 illustrates a general Bayer pattern pixel structure of an imaging device;

FIG. 8 is a diagram illustrating arrangement of pixels for phase difference detection based on the Bayer pattern pixel structure of FIG. 7;

FIGS. 9A and 9B illustrate phase difference pixels of an example of an imaging device configured in a horizontal direction, according to an embodiment of the invention;

FIG. 10 illustrates an example of phase difference pixels of an imaging device configured in a vertical direction, according to an embodiment of the invention;

FIG. 21 illustrates an example of an imaging device in which a plurality of different phase difference pixels are configured, according to an embodiment of the invention.

DETAILED DESCRIPTION

Figure 1:
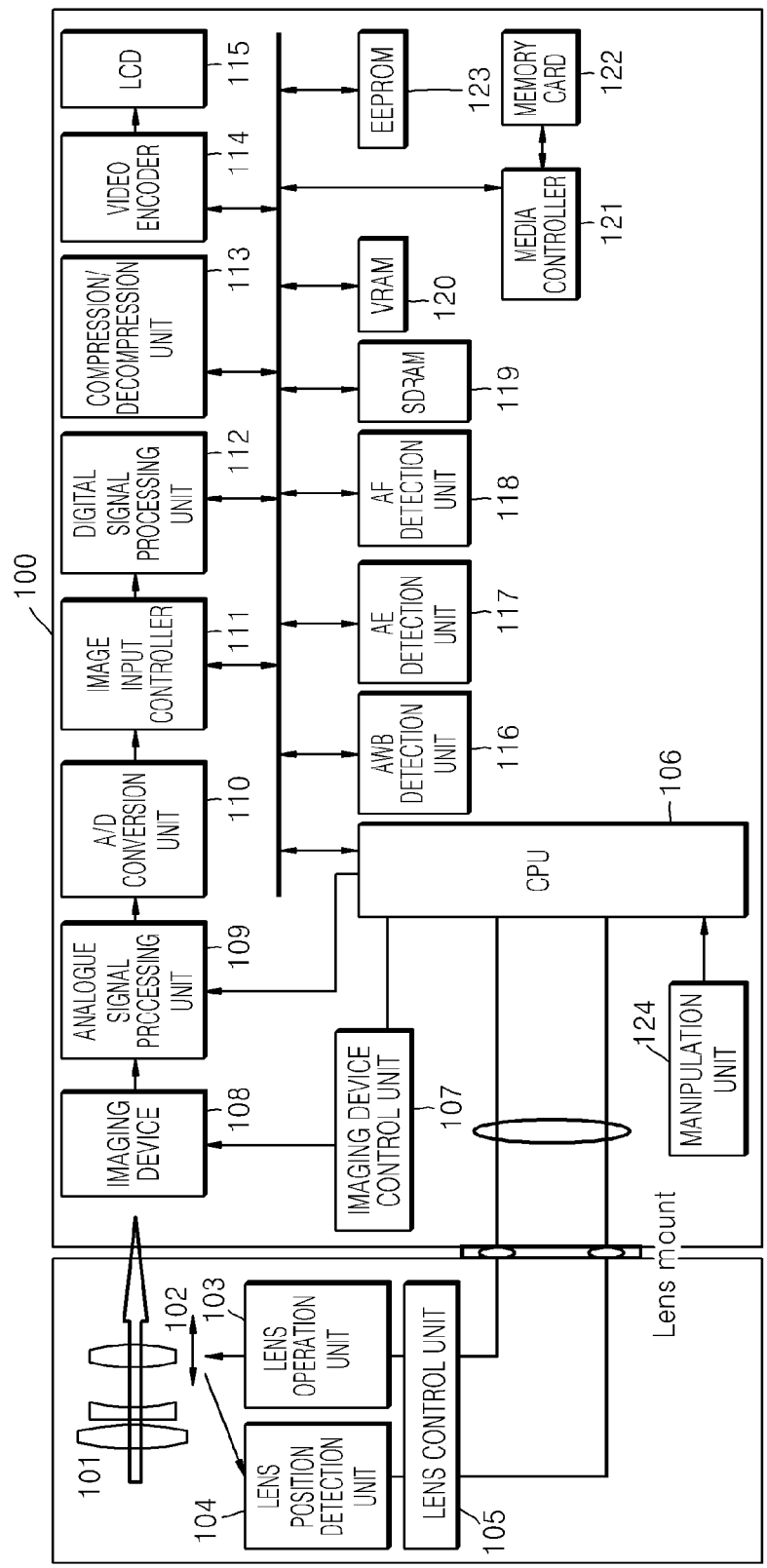
FIG. 1 is a block diagram illustrating a structure of an example of a digital image processing device including an imaging device according to an embodiment of the invention.

As the invention allows for various changes and numerous embodiments, particular embodiments will be illustrated in the drawings and described in detail in the written description. However, this is not intended to limit the invention to particular modes of practice, and it is to be appreciated that all changes, equivalents, and substitutes that do not depart from the spirit and technical scope of the invention are encompassed in the invention. In the description of the invention, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the specification are merely used to describe particular embodiments, and are not intended to limit the invention. An expression used in the singular encompasses the expression of the plural, unless it has a clearly different meaning in the context. In the specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The invention will now be described more fully with reference to the accompanying drawings, in which embodiments of the invention are shown. In the drawings, like reference numerals denote like elements, and thus a detailed description thereof is provided once. As used herein, the term "and/or" includes any and all combinations of one or more of the associated listed items.

FIG. 1 is a block diagram illustrating an example of a structure of a digital image processing device 100 including an imaging device according to an embodiment of the invention.

Referring to FIG. 1, a lens is separable from the digital image processing device 100, but an imaging device 108 is configured in an integrated manner with the digital image processing device 100. In addition, the digital image processing device 100 including the imaging device 108 may perform phase difference autofocus (AF) and contrast AF.

The digital image processing device 100 includes an imaging lens 101 including a focus lens 102. The digital image processing device 100 has focus detection capability through operation of the focus lens 102. The imaging lens 101 includes a lens operation unit 103 that operates the focus lens 102, a lens position detection unit 104 that detects a position of the focus lens 102, and a lens control unit 105 that controls the focus lens 102. The lens control unit 105 transmits information on focus detection to a CPU 106 of the digital image processing device 100.

The digital image processing device 100 includes the imaging device 108 and thus captures light that is incident on and transmitted through the imaging lens 101, thereby generating an image signal. The imaging device 108 may include a plurality of photoelectric conversion units (not shown) arranged in a matrix form and a transfer path (not shown) that transfers charges from the photoelectric conversion units to read an image signal.

An imaging device control unit 107 generates a timing signal, thereby controlling the imaging device 108 to capture an image. In addition, the imaging device control unit 107 sequentially reads out image signals when accumulation of charges on each of a plurality of scan lines is terminated.

The read-out image signals are converted to digital image signals by an A/D conversion unit 110 via an analogue signal processing unit 109, and then input to an image input controller 111 and processed therein.

The digital image signals input to the image input controller 111 are subjected to auto white balance (AWB), auto exposure (AE) and AF calculations respectively performed by an AWB detection unit 116, an AE detection unit 117, and an AF detection unit 118. The AF detection unit 118 outputs a detection value with respect to a contrast value during AF and outputs pixel information to the CPU 106 during phase difference AF, thereby allowing phase difference calculation to be performed in the CPU 106. The phase difference calculation performed by the CPU 106 may be obtained by calculating a correlation between a plurality of pixel row signals. As a result of the phase difference calculation, a position or direction of a focal point may be obtained.

The image signals may also be stored in a synchronous dynamic random access memory (SDRAM) 119, that is, a temporary memory. A digital signal processing unit 112 performs a series of image signal processing operations such as gamma correction to create a displayable live view image or captured image. A compression/decompression unit 113 compresses an image signal in a JPEG compression format or an H.264 compression format or decompresses the image signal when image signal processing is performed. An image file including the image signal compressed in the compression/decompression unit 113 is transmitted to a memory card 122 via a media controller 121 to be stored therein.

Image information for display is stored in a video RAM (VRAM) 120 and an image is displayed on an LCD 115 via a video encoder 114. The CPU 106, which acts as a control unit, controls overall operations of each unit of the digital image processing device 100. An electrically erasable programmable read-only memory (EEPROM) 123 stores and maintains information for correcting defects of pixels of the imaging device 108 or adjustment information on the pixel defects. A manipulation unit 124 is a unit through which various commands of a user are input to manipulate the digital image processing device 100. The manipulation unit 124 may include various buttons such as a shutter-release button (not shown), a main button (not shown), a mode dial (not shown), a menu button (not shown), or the like.

Figure 2:
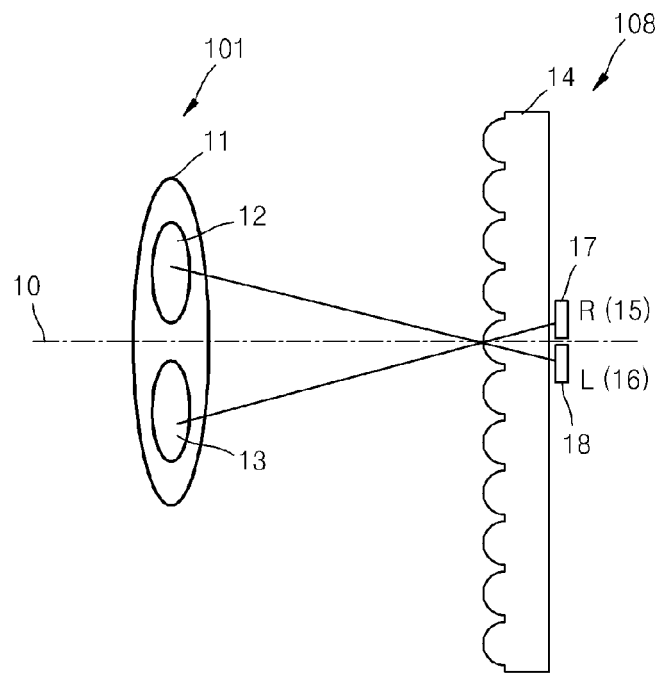
FIG. 2 is a diagram for explaining a principle of phase difference pixels by using the imaging device of FIG. 1, according to an embodiment of the invention.

FIG. 2 is a diagram for explaining an example of an AF principle of phase difference pixels by using the imaging device 108 of FIG. 1, according to an embodiment of the invention.

Referring to FIG. 2, light of a subject that has transmitted through an imaging lens 11 transmits through a micro lens array 14 to be incident on light receiving pixels R(15) and L(16). Masks 17 and 18 for restricting pupils 12 and 13 of the imaging lens 11 or restricted openings are respectively formed in portions of the light receiving pixels R(15) and L(16). Among the pupils 12 and 13 of the imaging lens 11, light from the pupil 12 above an optical axis 10 of the imaging lens 11 is incident on the light receiving pixel L(16), and light from the pupil 13 below the optical axis 10 of the imaging lens 11 is incident on the light receiving pixel R(15). Light that is reverse transmitted to the pupils 12 and 13 by the micro lens array 14 is incident on the light receiving pixels R(15) and L(16), which is referred to as pupil division.

Figure 3A:
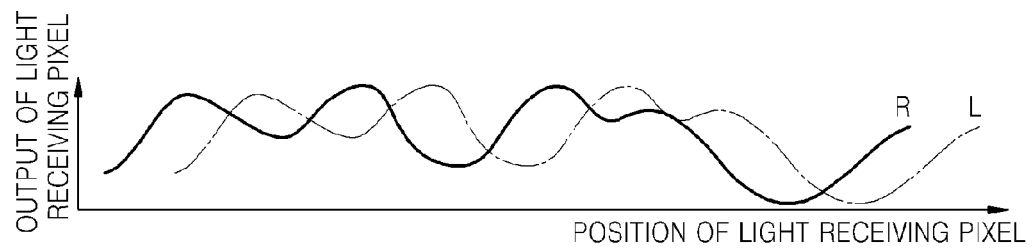
FIGS. 3A and 3B are graphs for explaining phase difference of light receiving pixels according to FIG. 2, according to an embodiment of the invention.
Figure 3B:
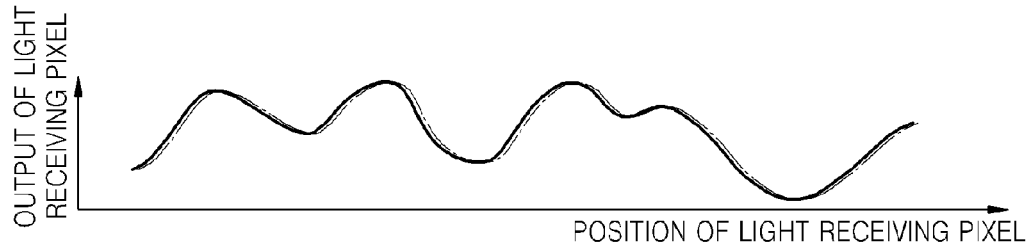

An example of continuous outputs of the light receiving pixels R(15) and L(16) by pupil division by the micro lens array 14 are illustrated in FIG. 3. In FIG. 3, a horizontal axis denotes positions of the light receiving pixels R(15) and L(16), and a vertical axis denotes output values of the light receiving pixels R(15) and L(16). Referring to FIG. 3, plots showing outputs of the light receiving pixels R(15) and L(16) exhibit the same shape, but exhibit different phases with respect to position. This is due to image formation positions of light from the eccentrically formed pupils 12 and 13 of the imaging lens 11 being different from each other. Thus, when focal points of light from the eccentrically formed pupils 12 and 13 are inconsistent with each other, the light receiving pixels R(15) and L(16) exhibit an output phase difference, as illustrated in FIG. 3A. On the other hand, when focal points of light from the eccentric pupils 12 and 13 are consistent with each other, images are formed at the same position as illustrated in FIG. 3B. In addition, a direction of focus may be determined from the focus difference. A front-focusing indicates that an object is in a front focus state and is illustrated in FIG. 3A. Referring to FIG. 3A, the phase of the output of the light receiving pixel R(15) is shifted further to the left than that in the focused state, and the phase of the output of the light receiving pixel L(16) is shifted further to the right than that in the focused state. In contrast, a back-focusing indicates that an object is in a back focus state. In this case, the phase of the output of the light receiving pixel R(15) is shifted further to the right than that in the focused state, and the phase of the output of the light receiving pixel L(16) is shifted further to the left than that in the focused state. The shift amount between the phases of the light receiving pixels R(15) and L(16) may be converted to a deviation amount between the focuses.

Figure 4:
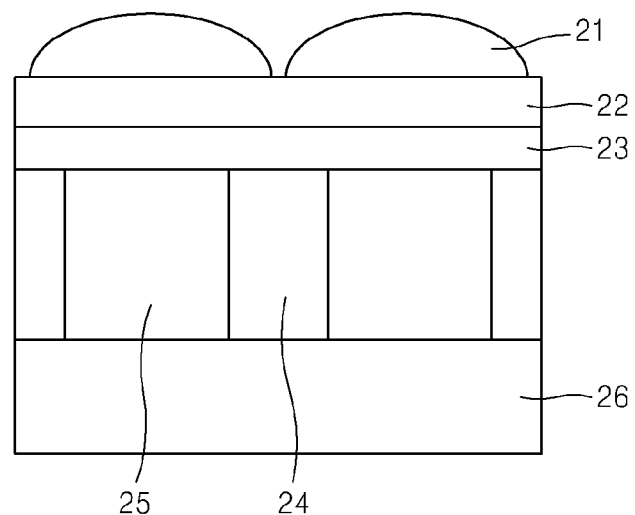
FIG. 4 is a diagram illustrating a structure of pixels constituting a general imaging device.

FIG. 4 is a diagram illustrating an example of a structure of pixels constituting a general imaging device.

Referring to FIG. 4, two pixels are illustrated. The two pixels include micro lenses 21, a surface layer 22, a color filter layer 23, a wire layer 24, photodiode layers 25, and a substrate layer 26. The drawing is illustrated in a simplified manner.

Light from a subject enters the photodiode layer 25 of each pixel via the micro lenses 21, and a photodiode in the photodiode layer 25 of each pixel generates charges that serve as pixel information. The generated charges are released through the wire layer 24. Such incident light from a subject is all light that has transmitted through an exit pupil of an imaging lens, and luminance information corresponding to a subject position may be obtained corresponding to a pixel position. In general, the color filter layer 23 may be a layer including pixels of red (R), green (G), and blue (B). Also, the color filter layer 23 may include pixels of cyan (C), magenta (M), and yellow (Y).

Figure 5:
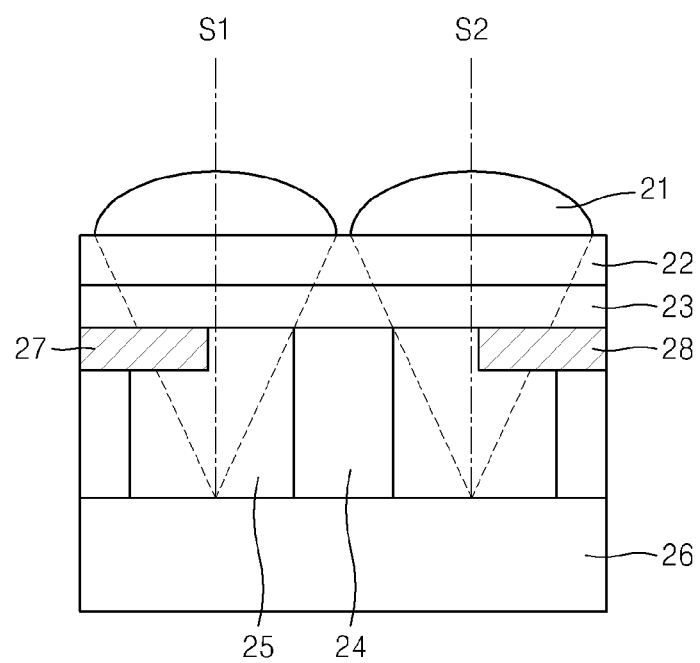
FIG. 5 is a diagram illustrating a structure of pixels of a phase difference imaging device in which masks are installed in openings, according to an embodiment of the invention.

FIG. 5 illustrates an example of a vertical configuration of phase difference pixels for obtaining signals of the R and L pixels illustrated in FIG. 2, in which masks 27 and 28 are installed in openings of the imaging device 108 of FIG. 4. The R and L pixels for phase difference detection are referred to as S1 and S2, respectively. In FIG. 5, S1 and S2 include the mask 27 for the R pixel and the mask 28 for the L pixel, respectively, each interposed between the micro lenses 21 and the photodiode layers 25. However, the positions of the masks 27 and 28 are not limited to the example illustrated in FIG. 5. For example, the masks 27 and 28 may be interposed somewhere between the micro lenses 21 and the photodiode layers 25. In FIG. 5, optical axes of the micro lenses 21 are each represented by a dashed dotted line, and paths through which light is incident from the micro lenses 21 are each represented by a dotted line. The amounts of light incident on the photodiode layers 25 are restricted by 50% by the masks 27 and 28 with respect to the optical axes of the micro lenses 21.

Figure 6A:
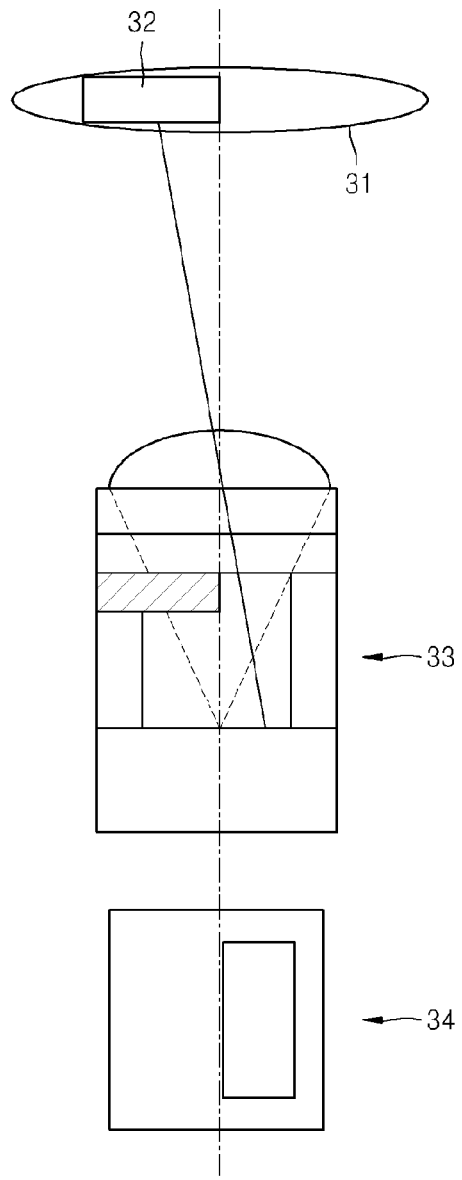
FIGS. 6A and 6B are diagrams illustrating a relationship between positions of pixels of the imaging device of FIG. 5 and imaging lenses, according to an embodiment of the invention.
Figure 6B:
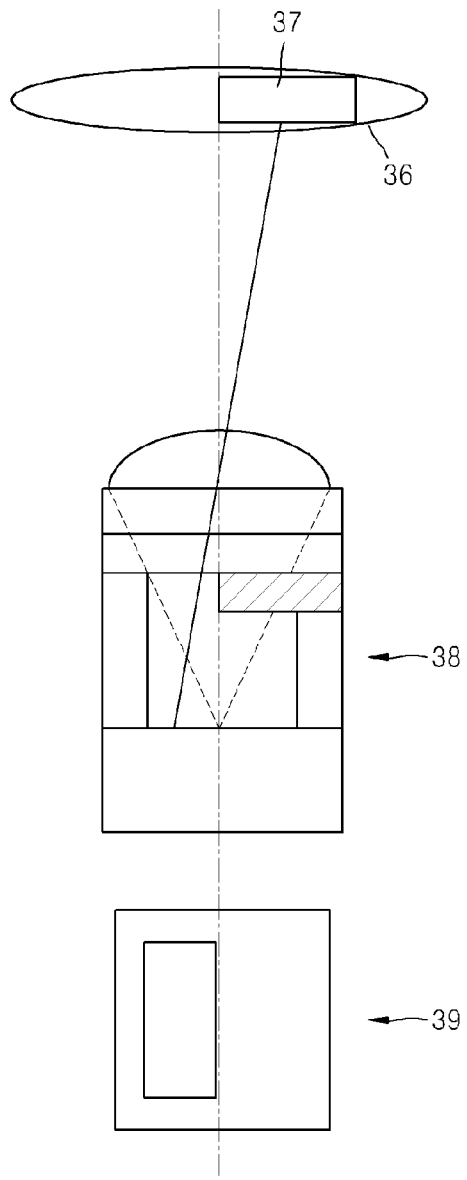

FIGS. 6A and 6B are diagrams illustrating an example of a relationship between positions of pixels of the imaging device of FIG. 5 and imaging lenses, according to an embodiment of the invention.

FIG. 6A illustrates an imaging lens 31, an R pixel (S1) 33 of the imaging device of FIG. 5, a top view of a mask 34, and a pupil 32. FIG. 6B illustrates an imaging lens 36, an L pixel (S2) 38 of the imaging device of FIG. 5, a top view of a mask 39, and a pupil 37. In this regard, the masks 34 and 39 each have an aperture ratio of 50% with respect to optical axes of the imaging lenses 31 and 36.

The R pixel (S1) 33 and the L pixel (S2) 38 illustrated in FIGS. 6A and 6B may not necessarily be arranged adjacent to each other. In addition, FIGS. 6A and 6B illustrate a configuration of pixels arranged in vicinity of the optical axes of the imaging lenses 31 and 36. If pixels are arranged further away from the optical axes of the imaging lenses 31 and 36, to correct the $\cos^4 \theta$ law, positions of the optical axes of the imaging lenses 31 and 36 and the masks 34 and 39 are shifted in an external direction of a screen.

FIG. 7 illustrates an example of a general Bayer pattern pixel structure of an imaging device.

Referring to FIG. 7, color filters of three colors, i.e., red (R), green (G), and blue (B), are arranged and 4 pixels are configured as a single unit. In this regard, two G pixels are arranged in the unit. An arrangement of pixels for phase difference detection based on the Bayer pattern pixel structure of FIG. 7 is illustrated in FIG. 8.

Referring to FIG. 8, general Bayer pattern pixels BY1 and BY2 are arranged and PH1 including R pixels (S1) for phase difference detection and PH2 including L pixels (S2) for phase difference detection are arranged therebetween. Conventionally, phase difference pixels are arranged using G Bayer pattern pixels. However, it is difficult to perform interpolation computation for a general Bayer arrangement by using the G pixels and thus the S1 and S2 pixels are regarded as defect pixels so that they are not effectively used and the quality of image captured using the imaging device including the phase difference pixels is deteriorated compared to that of images captured using a general imaging device without phase difference pixels. In addition, compared to general pixels, it is necessary for phase difference pixels to have an aperture ratio of 50% or less and thus the amount of light incident on the phase difference pixels is 50% or less. The reduced aperture ratio may make it difficult to perform AF in low luminance, which may make photographing difficult.

Thus, in an imaging device according to an embodiment of the invention, a pixel circuit is configured such that phase difference detection is performed in all of pixels thereof, whereby good image quality without pixel defects is obtained and phase difference detection may be performed in all the pixels. In addition, an area of openings of phase difference pixels is not made small and AF may be performed even in low luminance. A configuration of only 16 pixels of an example of an imaging device is illustrated in FIGS. 9A and 9B.

FIGS. 9A and 9B illustrate phase difference pixels of an imaging device configured in a horizontal direction, according to an embodiment of the invention. FIG. 9A illustrates a configuration of the color filters of R, G, and B in the R pixels (S1) and the color filters of R, G, and B in the L pixels (S2), and FIG. 9B illustrates arrangement of photoelectric conversion openings. In FIG. 9A, RLa denotes that an opening for an L pixel is formed in an R color filter. FIG. 9B illustrates the R and L pixels each having an aperture ratio of about 50% with respect to the optical axes of the imaging lenses 31 and 36, each opening of which does not contact the optical axes or contacts but does not include the optical axes. The openings illustrated in FIG. 9B are referred to as "A-type opening" for convenience of explanation, and thus a configuration of phase difference pixels in the horizontal direction is referred to as HA.

In FIG. 9A, the L pixels are arranged in a first row 41 and a second row 42, and the R pixels are arranged in a third row 43 and a fourth row 44. Pixel row signals of the pixels of the first row 41 and the second row 42 or a sum (binning output) of the pixel row signals of the L pixels of the first low 41 and the second row 42, and pixel row signals of the pixels of the third row 43 and the fourth row 44 or a sum (binning output) of the pixel row signals of the pixels of the third row 43 and the fourth row 44 are obtained as illustrated in FIG. 3 to calculate a phase difference between the R and L pixels. The pixel row signals are obtained as a line image in the horizontal direction. Thus, an image with a contrast change in the horizontal direction may be detected. The pixel rows in the HA configuration are composed of pixels each having an aperture ratio of about 50% with respect to the optical axes of the imaging lenses 31 and 36 (see FIG. 6), each opening of which does not contact the optical axes or contacts but does not include the optical axes. Therefore, crosstalk between adjacent pixels does not occur and a position of a focal point in the horizontal direction of a subject may be obtained from information about the phase difference.

FIGS. 10A and 10B illustrate phase difference pixels of an imaging device configured in a vertical direction, according to an embodiment of the invention.

FIG. 10A illustrates an example of a configuration of the color filters of R, G, and B in the R pixels (S1) and the color filters of R, G, and B in the L pixels (S2), and FIG. 10B illustrates arrangements of photoelectric conversion openings. In FIG. 10A, RLa denotes that an opening for an L pixel is formed in an R color filter. FIG. 10 illustrates the R and L pixels each having an aperture ratio of about 50% with respect to the optical axes of the imaging lenses 31 and 36 (see FIG. 6), each opening of which does not contact the optical axes or contacts but does not include the optical axes. A configuration of phase difference pixels in the vertical direction is referred to as VA.

In FIG. 10A, the L pixels are arranged in a first row 51 and a second row 52, and the R pixels are arranged in a third row 53 and a fourth row 54. The rows in FIG. 10A are arranged vertically, and will be referred to rows rather than columns for consistency with other arrangements. Pixel row signals of the pixels of the first row 51 and the second row 52 or a sum (binning output) of the pixel row signals of the L pixels of the first row 51 and the second row 52, and pixel row signals of the pixels of the third row 53 and the fourth row 54 or a sum (binning output) of the pixel row signals of the pixels of the third row 53 and the fourth row 54 are obtained as illustrated in FIG. 3 to calculate a phase difference between the R and L pixels.

The pixel row signals are obtained as a line image in the vertical direction. The pixel row signals in the VA configuration may be used to detect an image with a contrast change in the vertical direction, and thus a position of a focal point in the vertical direction of a subject may be obtained from information about the phase difference.

Figure 11A:
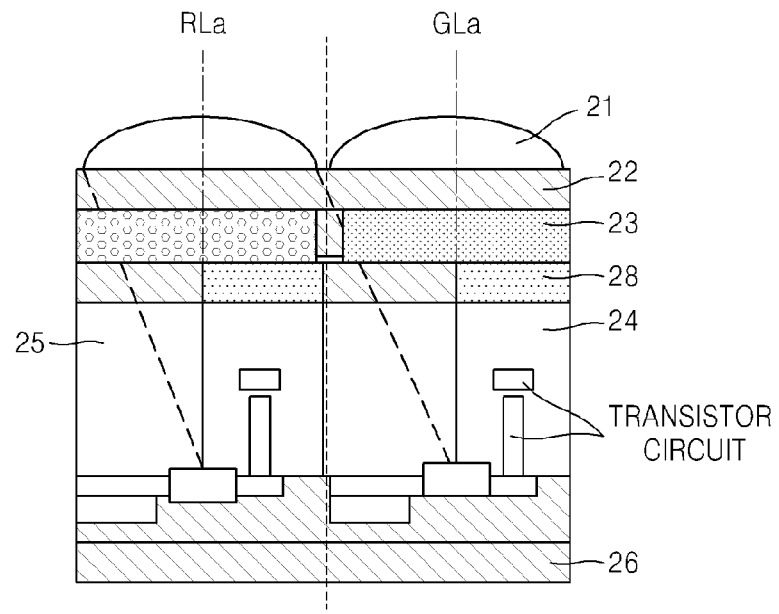
FIGS. 11A and 11B illustrate an example of the vertical configuration of the phase difference pixels of FIGS. 9A and 9B, according to embodiments of the invention.
Figure 11B:
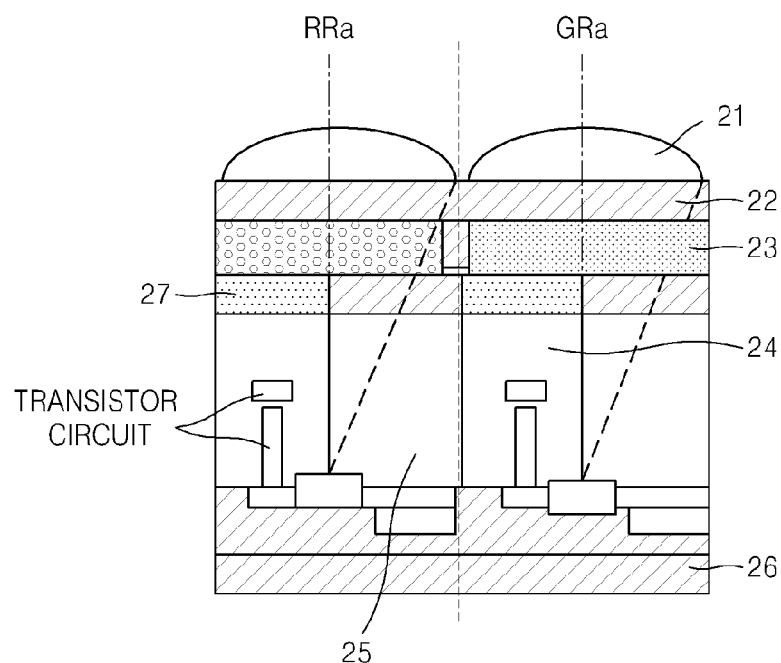

FIGS. 11A and 11B illustrate examples of vertical configurations of RLa and GLa pixels and RRa and GRa pixels, respectively, of the HA configuration illustrated in FIG. 9, according to an embodiment of the invention.

Referring to FIGS. 11A and 11B, each of the RLa and RRa pixels and each of the GLa and GRa pixels include a color filter layer 23, in which the color filter layer 23 in the RLa and RRa pixels is an R color filter and in which the color filter layer 23 in the GLa and GRa pixels is a G color filter, and the RLa and GLa pixels each include a mask 28 for an L pixel and the RRa and GRa pixels each include a mask 27 for an R pixel. While sizes of the masks 27 and 28 may be the same as those of pixels of a general imaging device, a position relationship between the masks 27 and 28 and micro lenses 21 is different from that in a general imaging device. Optical axes of the micro lenses 21 are eccentrically formed respectively from centers of openings and the openings contact but do not include the optical axes. In FIG. 11, the masks 27 and 28 are formed on non-opening sides with respect to the optical axes so that unnecessary light is not incident on the openings. Referring to FIG. 11, similar to the R and L pixels illustrated in FIG. 5, the RLa and GLa pixels and the RRa and GRa pixels each include a wire layer 24, a photodiode layer 25, and a substrate layer 26; however, unlike the R and L pixels of FIG. 5, the pixels of FIG. 11 include transistor circuits.

Figure 12:
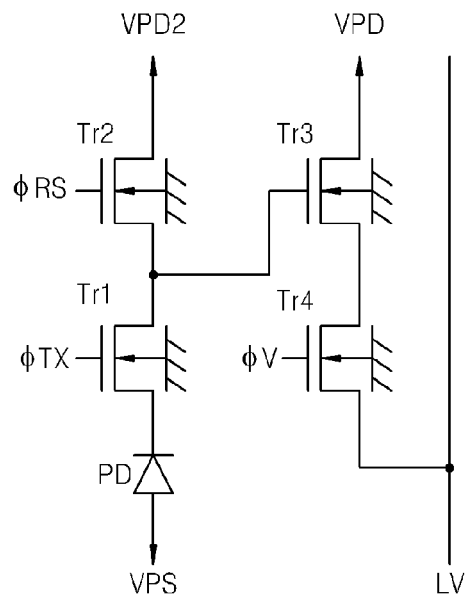
FIG. 12 is an example of a circuit diagram illustrating a basic pixel structure of an imaging device according to an embodiment of the invention.

FIG. 12 is a circuit diagram illustrating a basic pixel structure of an imaging device according to an embodiment of the invention.

Referring to FIG. 12, an example of the basic pixel structure of an imaging device includes a buried-type photodiode PD, a transistor Tr1 having a source connected to an anode of the PD, a transistor Tr2 having a source connected to a drain of the transistor Tr1, a transistor Tr3 having a gate connected to an access node connected to the drain of the transistor Tr1 and the source of the transistor Tr2, and a transistor Tr4 having a drain connected to a source of the transistor Tr3. A direct voltage VPS is applied to a cathode of the photodiode PD and back gates of the transistors Tr1 through Tr4 and a direct voltage (VPD2, VPD) is applied to a drain of each of the transistors Tr2 and Tr3, respectively. A φTX signal, a φRS signal, and a φV signal are respectively applied to gates of the transistors Tr1, Tr2, and Tr4. Unnecessary charges are initially reset by the transistor Tr2, charges generated by the photodiode PD are migrated into a floating diffusion layer FD of the transistor Tr1, the charges are amplified by the transistor Tr3, a pixel is selected by the transistor Tr4, and a signal of the pixel is output from a vertical output line (LV).

Figure 13:
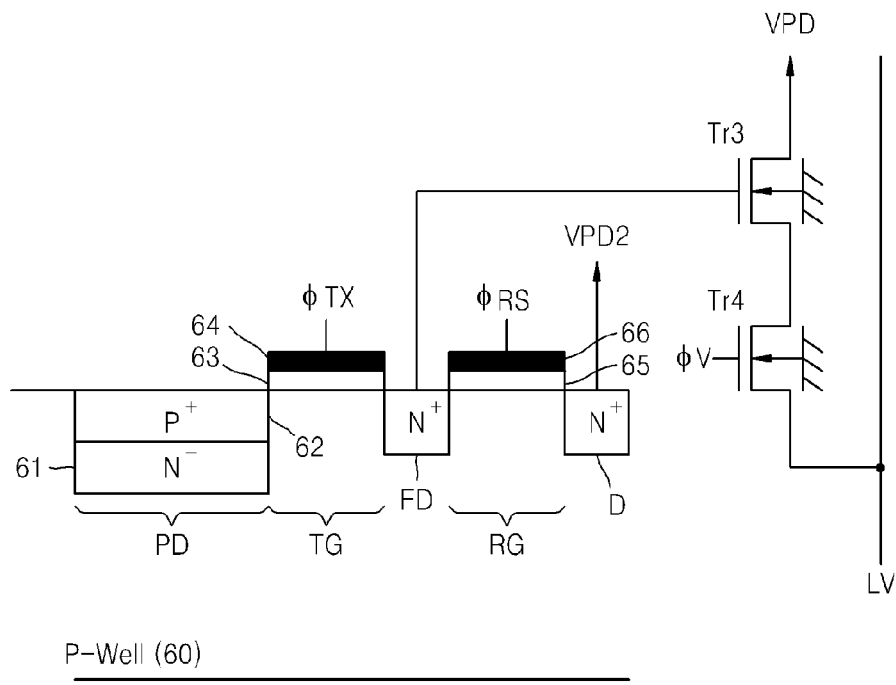
FIG. 13 is an example of a circuit diagram particularly illustrating photoelectric conversion portions of pixels illustrated in FIG. 12, arranged on a silicon substrate, according to an embodiment of the invention.

FIG. 13 is a circuit diagram particularly illustrating an example of photoelectric conversion portions of a pixel illustrated in FIG. 12, arranged on a silicon substrate, according to an embodiment of the invention.

Referring to FIG. 13, an N-type layer 61 is buried in a P-type substrate or P-type well layer 60 and a P-type layer 62 is formed on the N-type layer 61, thereby completing formation of a buried-type photodiode PD. A transmission gate TG including an insulating layer 63 and a gate electrode 64 is formed on a surface of a region that is adjacent to a region in which the buried-type photodiode PD is formed, an N-type floating diffusion layer FD is formed below a region that is adjacent to the region in which the transmission gate TG is formed, a reset gate RG including an insulating layer 65 and a gate electrode 66 is formed on a surface of a region that is adjacent to the N-type floating diffusion layer FD, and an N-type diffusion layer is formed below a region that is adjacent to the region in which the reset gate RG is formed. The buried-type photodiode PD is formed such that the P-type layer 62, which is highly concentrated, is formed on a surface of the N-type layer 61, which is a buried type layer. In addition, the N-type layer 61, the N-type floating diffusion layer FD, and the transmission gate TG constitute the transistor Tr1, and the N-type floating diffusion layer FD, the N-type diffusion layer, and the reset gate RG constitute the transistor Tr2. The gate of the transistor Tr3 is connected to the N-type floating diffusion layer FD. In other words, each of a plurality of pixels includes 4 transistors as well as photoelectric conversion portions. This is referred to as a pixel of a 4-Tr structure. Such a pixel structure needs a large area in semiconductor manufacturing processes and thus an area available for photoelectric conversion is restricted. In addition, it is necessary to fabricate a variety of transistors or wire circuits in addition to photoelectric conversion openings. Thus, a circuit is generally formed next to a photoelectric conversion unit in each pixel and arrangement of the circuit is the same in all the pixels. That is, in all the pixels, the circuit is formed next to the photoelectric conversion opening in the same direction. In embodiments of the invention, the arrangements of the photoelectric conversion openings and the circuits are optimized.

Meanwhile, as the number of pixels of an imaging device has recently increased and, accordingly, it is difficult to obtain areas of openings, there are many cases in which transistors are formed between pixels instead of in each pixel to obtain the areas of openings. For example, FIG. 14 illustrates an example of a circuit in which four pixels share a reset transistor and an amplification transistor and a selection transistor selects transmission transistors.

Figure 14:
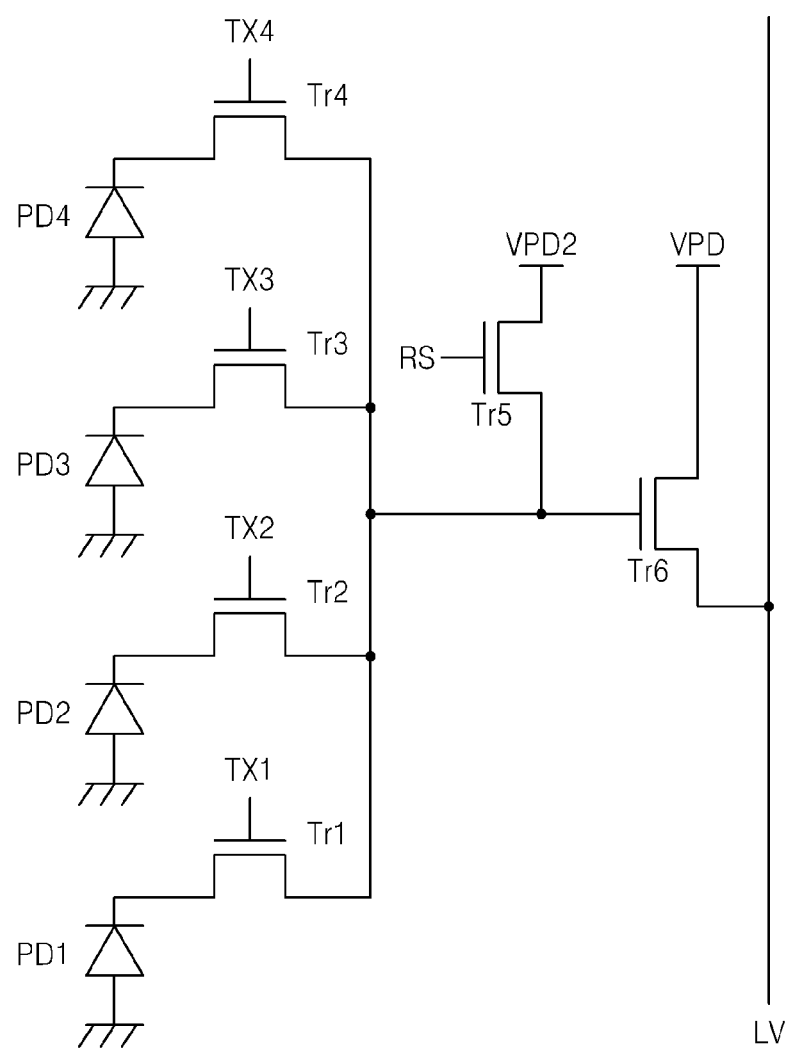
FIG. 14 is a circuit diagram illustrating an example of a structure of pixels of an imaging device including one example of a general transistor.
Figure 15:
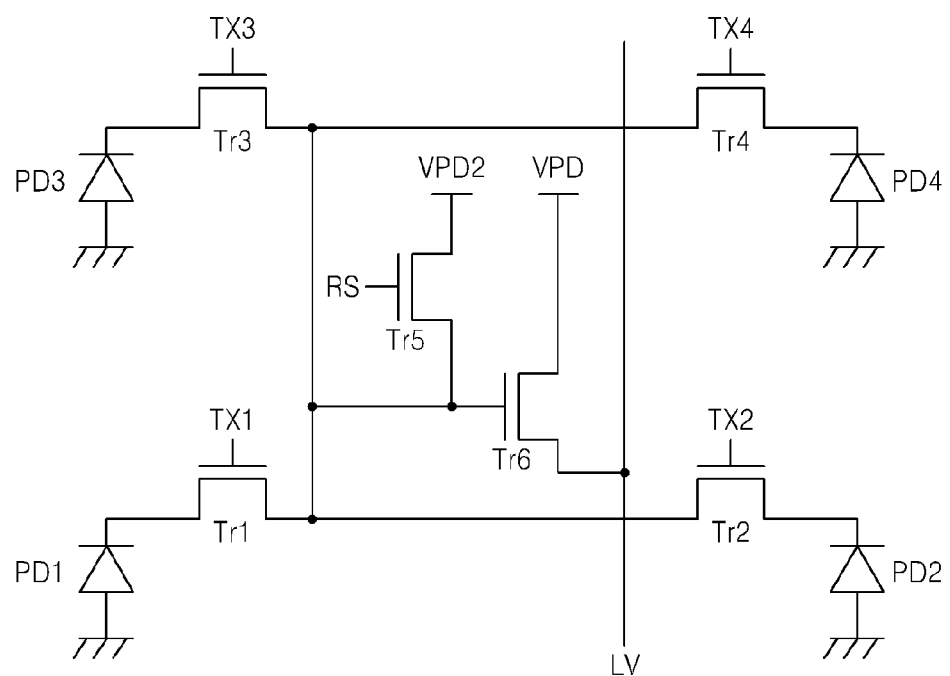
FIG. 15 is a circuit diagram illustrating an example of a structure of pixels of an imaging device including another example of a general transistor.

Referring to FIG. 14, transistors Tr1, Tr2, Tr3, and Tr4 are respectively formed for photodiodes PD1, PD2, PD3, and PD4 and respectively connected to transmission timing signals TX1, TX2, TX3, and TX4. In addition, a reset transistor Tr5 is connected to a reset signal RS. The four pixels share the reset transistor Tr5 and an amplification transistor Tr6. In FIG. 14, the four pixels share 6 transistors and thus they may be referred to as pixels of a 1.5-Tr structure. For two pixel sharing, for example, a 2.5-Tr structure or a 2-Tr structure may be used. The case in which the four pixels arranged in a vertical direction share the reset transistor Tr5 and the amplification transistor Tr6 is illustrated in FIG. 14, but the invention is not limited to the above example. For example, FIG. 15 illustrates a case in which four pixels arranged on top, bottom, left, and right sides share the reset transistor Tr5 and the amplification transistor Tr6. Referring to FIG. 15, the number of components of a circuit is the same as that in FIG. 14. Conventionally, these pixels are repeatedly configured in vertical and horizontal directions in the same pattern, each pixel is in a square arrangement, and circuits of transistors are arranged in a certain direction.

Figure 16:
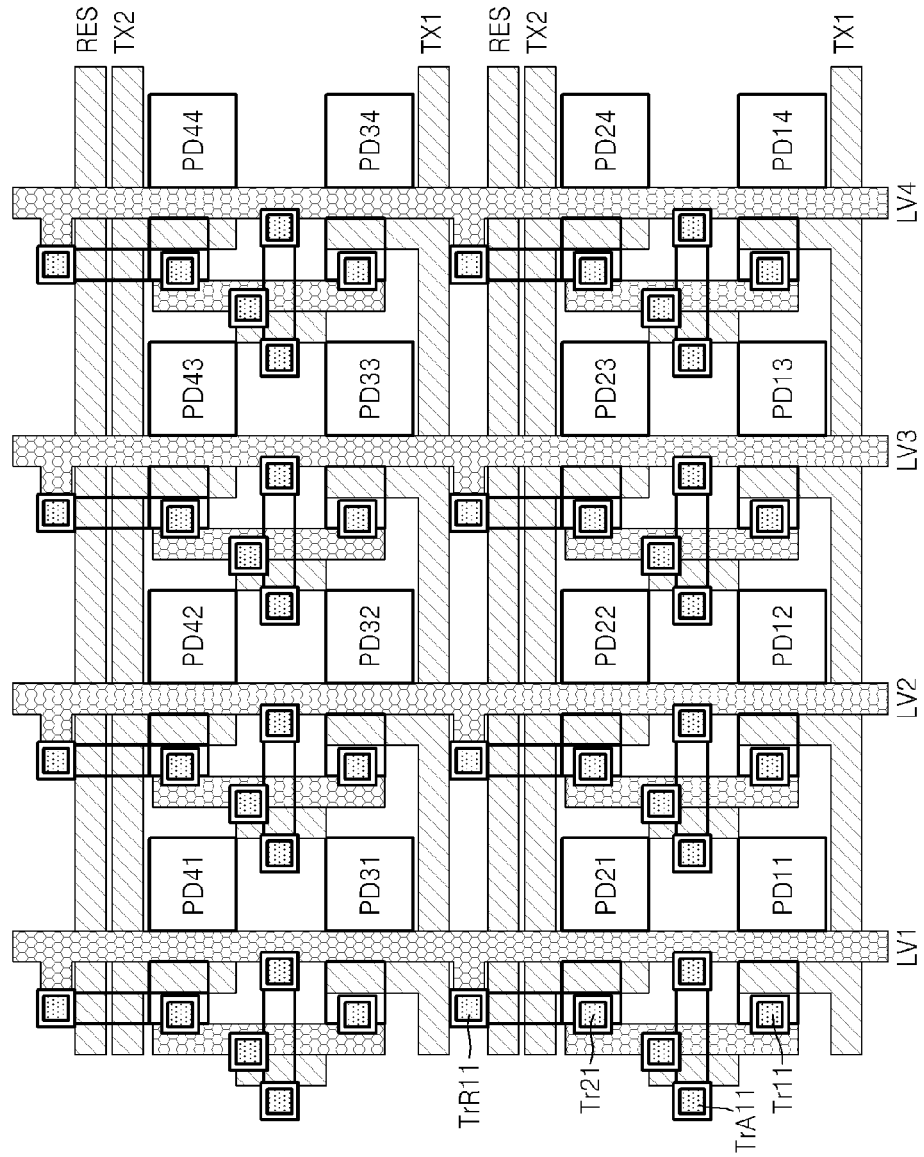
FIG. 16 is a circuit plan view of an example of a general imaging device.

FIG. 16 is an example of a circuit plan view of a general imaging device. Referring to FIG. 16, two pixels share a reset transistor and an amplification transistor. In other words, FIG. 16 illustrates a two-pixel unit in which photodiodes PD11 and PD21 share a reset transistor TrR11 and an amplification transistor TrA11. FIG. 16 only illustrates 8 units including 16 pixels, but the imaging device 108 actually includes more repeated configurations of the units, for example, 20 mega pixels. Four pixels including photodiodes PD11, PD12, PD21, and PD22 are in a Bayer pattern and R, G, and B color filters are formed on the photodiodes. In addition, a mask having openings only on the photodiodes exists on the plan view. Micro lenses are formed on the mask. A timing signal is routed around each of the photodiodes. Signal lines TX1 and TX2 for transmission timing and reset signal lines RES for reset are wired in a horizontal direction and pixel signal readout lines LV1, LV2, LV3, and LV4 are wired in a vertical direction, and such a configuration is repeatedly present.

Referring to FIG. 16, transmission transistors Tr11 and Tr21 are respectively positioned on left sides of the photodiodes PD11 and PD21. A side of the transmission transistor Tr11 is connected to the photodiode PD11 by a vertical line and a side of the transmission transistor Tr21 is connected to the photodiode PD21 by the vertical line, and the reset transistor TrR11 is positioned in front of the transmission transistors Tr11 and Tr21. The transmission transistors Tr11 and Tr21 are simultaneously connected to the amplification transistor TrA11 and an output side is connected to the pixel signal readout line LV1.

Outputs of the photodiodes PD11 and PD21 are switched by timing of the horizontal signals TX1 and TX2. The transmission transistors Tr11 and Tr21 selectively transmit the outputs of the photodiodes PD11 and PD21 and the amplification transistor TrA11 selectively amplifies the outputs of the photodiodes PD11 and PD21. The reset transistor TrR11 resets the photodiodes PD11 and PD21. In the example illustrated, all the pixels, all the circuits and lines of transistors are positioned on a left side of photodiodes and the photodiodes are periodically arrayed at an equal interval both in horizontal and vertical directions.

Figure 17:
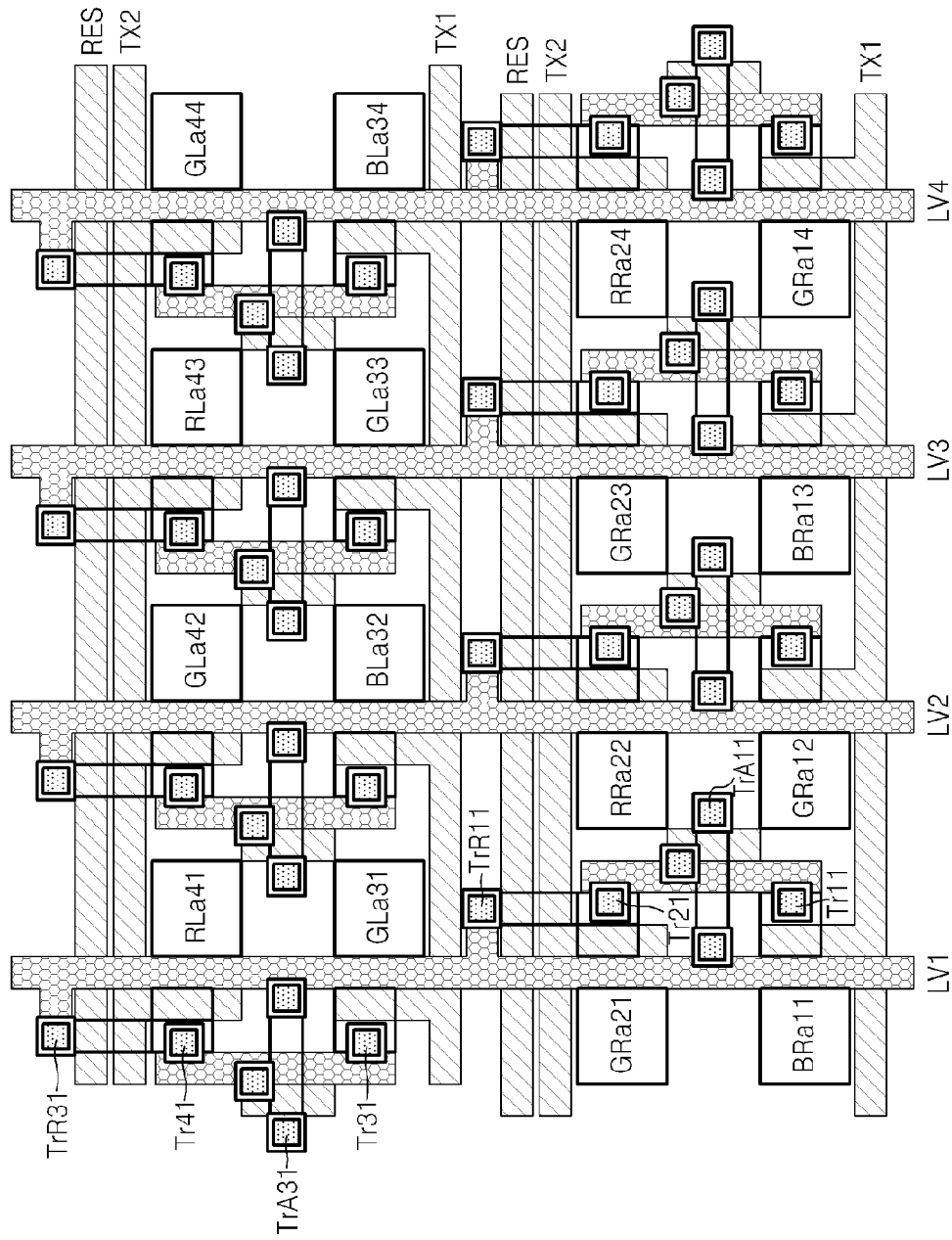
FIG. 17 is a circuit plan view of an example of an imaging device according to an embodiment of the invention.

FIG. 17 is a circuit plan view of an example of an imaging device according to an embodiment of the invention. FIG. 17 illustrates the HA configuration illustrated in FIG. 9 and that two pixels share a reset transistor and an amplification transistor. Referring to FIG. 17, four pixels including photodiodes RLa41, GLa31, GLa42, and BLa32 indicate a unit including R, G, G, and B pixels arranged in a Bayer pattern. The Bayer pattern pixel structure corresponds to phase difference pixels, i.e., L pixels, and constitutes a first pixel row in phase difference calculation. Four pixels including photodiodes RRa22, GRa12, GRa23, and BRa13 indicate a unit including R, G, G, and B pixels in a Bayer pattern, and the Bayer pattern pixel unit structure corresponds to phase difference pixels, i.e., R pixels, and constitutes a second pixel row in phase difference calculation.

In phase difference detection, the pixels including the photodiodes RLa41 and GLa31 of the first pixel row correspond to the pixels including the photodiodes RRa22 and GRa12 of the second pixel row. Similarly, the pixels including the photodiodes GLa42 and BLa32 of the first pixel row correspond to the pixels including the photodiodes GRa23 and BRa13 of the second pixel row. Although readout lines for the first and second pixel rows are different from each other, a pixel signal that is temporarily stored in a memory is used in correlation calculation and thus this does not matter.

Transmission transistors Tr41 and Tr31 are respectively positioned on left sides of the photodiodes RLa41 and GLa31 of the L pixels. Outputs of the transmission transistors Tr41 and Tr31 are connected to each other by wiring and connected to a reset transistor TrR31. In addition, the transmission transistors Tr41 and Tr31 are connected to an amplification transistor TrA31 therebetween. An output of the amplification transistor TrA31 is connected to a signal readout line LV1.

Transmission transistors Tr21 and Tr11 are respectively positioned on right sides of photodiodes GRa21 and Bra11 of the R pixels. Outputs of the transmission transistors Tr21 and Tr11 are connected to each other by wiring. The transmission transistors Tr21 and Tr11 are connected to an amplification transistor TrA11 therebetween. An output of the amplification transistor TrA11 is connected to the signal readout line LV1. Each of the L pixels and the R pixels is repeatedly arranged to configure L pixel series and R pixel series. An operation of a circuit of each transistor is the same as that in FIG. 16.

In the L pixel series and the R pixel series, transmission transistors, reset transistors, amplification transistors, and lines, with photodiodes therebetween, are positioned on opposite sides. The L pixels and the R pixels are configured as described above, and thus do not have reduced areas of openings.

Figure 18:
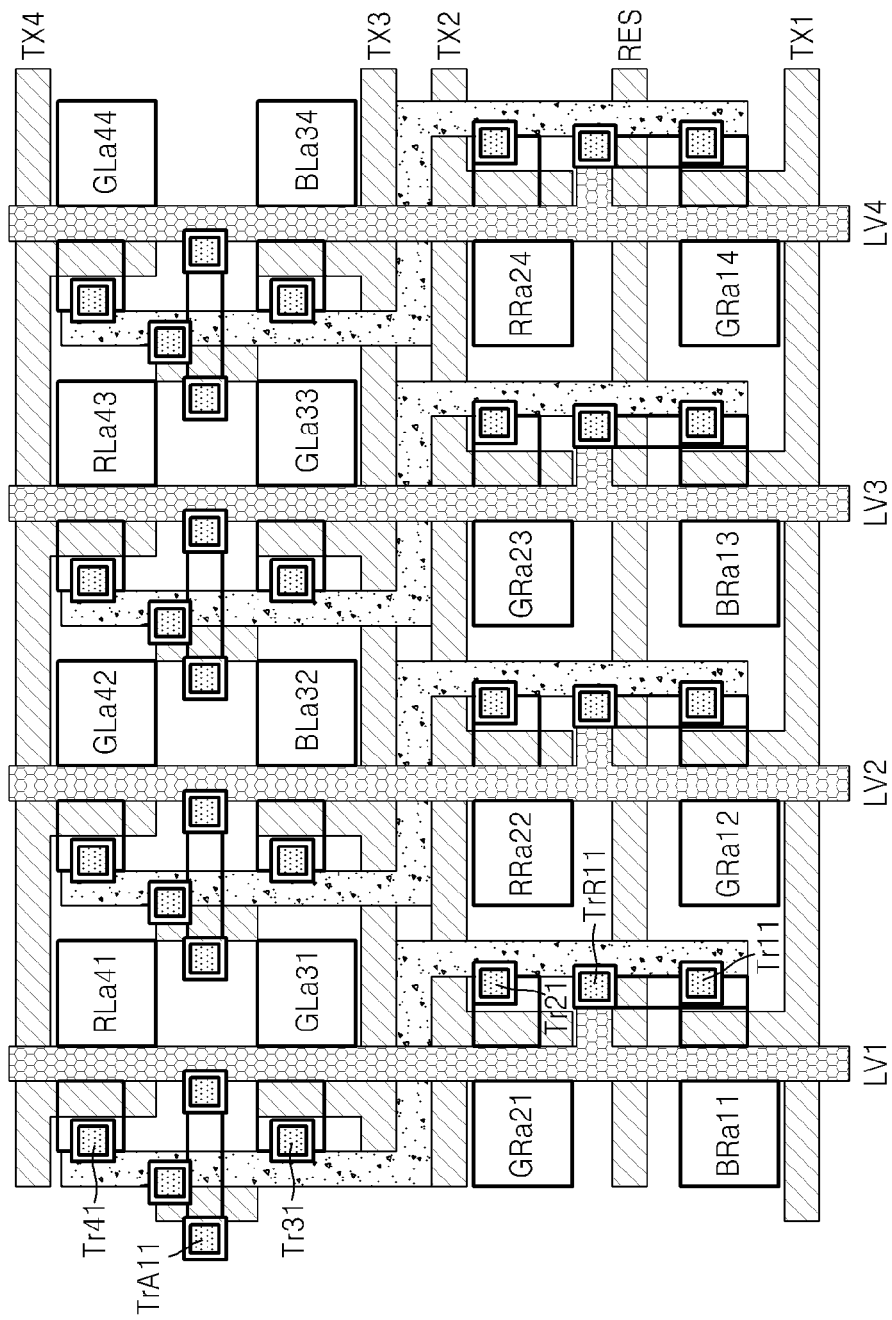
FIG. 18 is a circuit plan view of an example of an imaging device according to another embodiment of the invention.

FIG. 18 is a circuit plan view of an example of an imaging device according to another embodiment of the invention. FIG. 18 illustrates the HA configuration illustrated in FIG. 9 and that vertically arranged four pixels share a reset transistor and an amplification transistor. Referring to FIG. 18, as illustrated in FIG. 17, four pixels including photodiodes RLa41, GLa31, GLa42, and BLa32 indicate a unit including R, G, G, and B pixels arranged in a Bayer pattern. The Bayer pattern pixel unit structure corresponds to phase difference pixels, i.e., L pixels, and constitutes a first pixel row in phase difference calculation. Four pixels including photodiodes RRa22, GRa12, GRa23, and BRa13 indicate a unit including R, G, G, and B pixels in a Bayer pattern, and the Bayer pattern pixel unit structure corresponds to phase difference pixels, i.e., R pixels, and constitutes a second pixel row in phase difference calculation. In phase difference detection, the pixels including the photodiodes RLa41 and GLa31 of the first pixel row correspond to the pixels including photodiodes GRa21 and BRa11 of the second pixel row.

Transmission transistors Tr41 and Tr31 are respectively positioned on left sides of the photodiodes RLa41 and GLa31 of the L pixels. Outputs of the transmission transistors Tr41 and Tr31 are connected to each other by wiring. Transmission transistors Tr21 and Tr11 are respectively positioned on right sides of the photodiodes GRa21 and Bra11 of the R pixels. Outputs of the transmission transistors Tr21 and Tr11 are connected to each other by wiring. The transmission transistors Tr21 and Tr11 are also connected to output lines of the L pixels. The transmission transistors Tr41, Tr31, Tr21 and Tr11 selectively transfer charges according to timing of horizontal signals TX4, TX3, TX2 and TX1, respectively. The transferred charges pass through an N-type floating diffusion layer, and a pixel signal is amplified in an amplification transistor TrA11 and the amplified pixel signal passes through a vertical pixel readout line LV1 to be output. The vertical pixel readout line LV1 is also connected to a reset transistor TrR11 and outputs of the photodiodes RLa41, GLa31, GRa21 and Bra11 are reset by an RES signal. As described above, in the L pixel series, transmission transistors and amplification transistors are positioned on left sides of photodiodes. On the other hand, in the R pixel series, transmission transistors and reset transistors are positioned on right sides of photodiodes. In both the L pixel series and the R pixel series, transmission transistors and lines, with photodiodes therebetween, are positioned on opposite sides.

Figure 19:
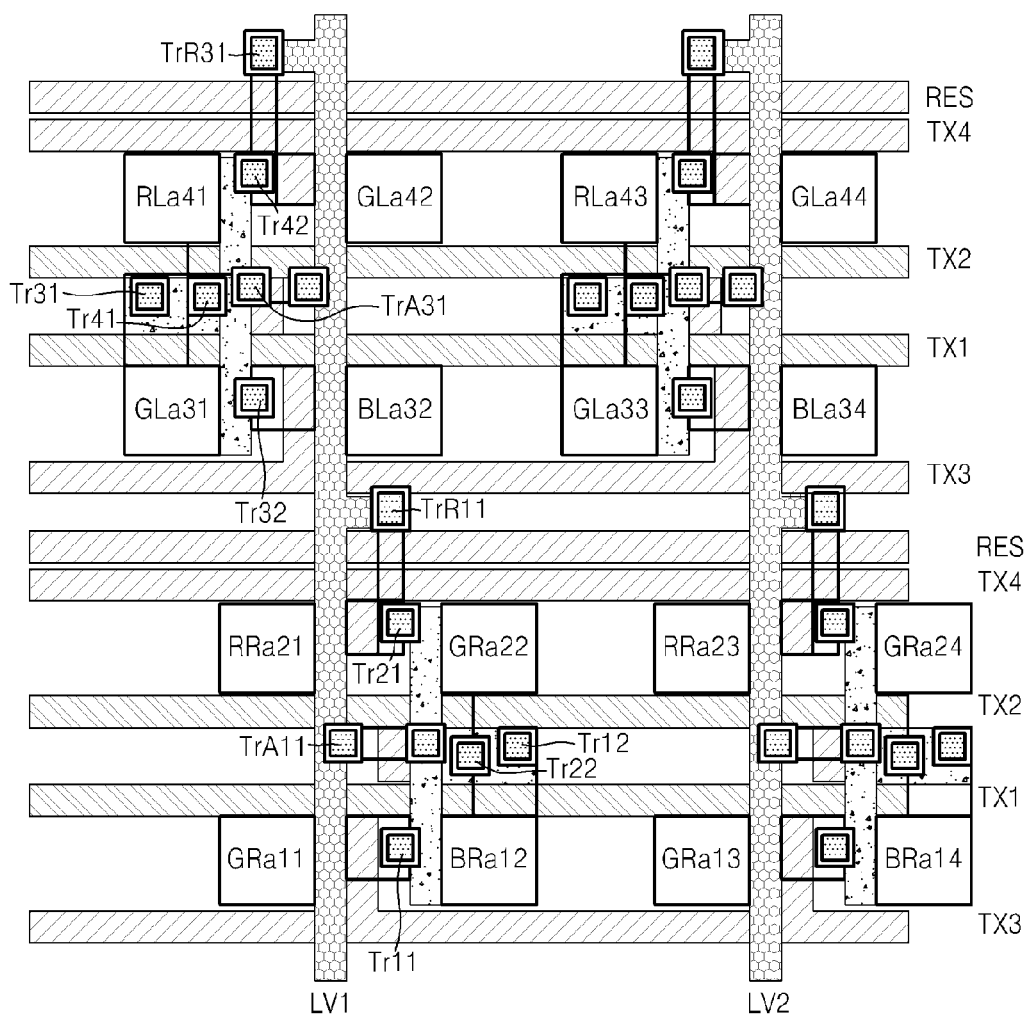
FIG. 19 is a circuit plan view of an example of an imaging device according to another embodiment of the invention.

FIG. 19 is a circuit plan view of an example of an imaging device according to another embodiment of the invention. FIG. 19 illustrates the HA configuration illustrated in FIG. 9 and that four pixels arranged in horizontal and vertical directions share a reset transistor and an amplification transistor. Referring to FIG. 19, as illustrated in FIGS. 17 and 18, four pixels including photodiodes RLa41, GLa31, GLa42, and BLa32 indicate a unit including R, G, G, and B pixels arranged in a Bayer pattern. The Bayer pattern pixel unit structure corresponds to phase difference pixels, i.e., L pixels, and constitutes a first pixel row in phase difference calculation. On the other hand, four pixels including photodiodes RRa21, GRa11, GRa22, and BRa12 indicate a unit including R, G, G, and B pixels in a Bayer pattern, and the Bayer pattern pixel unit structure corresponds to phase difference pixels, i.e., R pixels, and constitutes a second pixel row in phase difference calculation. In phase difference detection, the pixels including the photodiodes RLa41 and GLa31 of the first pixel row correspond to the pixels including the photodiodes RRa21 and GRa11 of the second pixel row.

Transmission transistors Tr42 and Tr32 are respectively positioned on left sides of photodiodes GLa42 and BLa32 of the L pixels. Outputs of the transmission transistors Tr42 and Tr32 are connected to each other by wiring. A transmission transistor Tr41 is positioned below the photodiode RLa41 of the L pixels and a transmission transistor Tr31 is positioned above the photodiode GLa31 of the L pixels. In addition, outputs of the four pixels including photodiodes RLa41, GLa31, GLa42, and BLa32 are connected to one another by wiring and also connected to an amplification transistor TrA31. Also, the outputs of the four pixels are connected to a reset transistor TrR31. The transmission transistors Tr41, Tr31, Tr42, and Tr32 selectively transfer charges according to timing of horizontal signals TX4, TX3, TX2, and TX1. The transferred charges pass through an N-type floating diffusion layer, and a pixel signal is amplified by the amplification transistor TrA31 and the amplified pixel signal passes through a vertical pixel readout line LV1 to be output. The reset transistor TrR31 is connected to the vertical pixel readout line LV1 and outputs of the photodiodes RLa41, GLa31, GLa42, and BLa32 are reset by an RES signal. On the other hand, the transmission transistors Tr21 and Tr11 are respectively positioned on right sides of the photodiodes RRa21 and GRa11 of the R pixels. Outputs of the transmission transistors Tr21 and Tr11 are connected to each other by wiring. A transmission transistor Tr22 is positioned below the photodiode GRa22 and a transmission transistor Tr12 is positioned above the photodiode BRa12.

Outputs of the four photodiodes RRa21, GRa11, GRa22, and BRa12 are connected to one another by wiring, to an amplification transistor TrA11, and to a reset transistor TrR11. The transmission transistors Tr21, Tr11, Tr22, and Tr12 selectively transfer charges according to timing of the horizontal signals TX4, TX3, TX2 and TX1. As described above, in L pixel series, transmission transistors, amplification transistors, and reset transistors are mainly positioned on left sides of four photodiodes, and, on the other hand, in R pixel series, transmission transistors, amplification transistors, and reset transistors are mainly positioned on right sides of four photodiodes. In the L and R pixel series, transistor circuits and lines, with photodiodes therebetween, are positioned on opposite sides.

Figure 20:
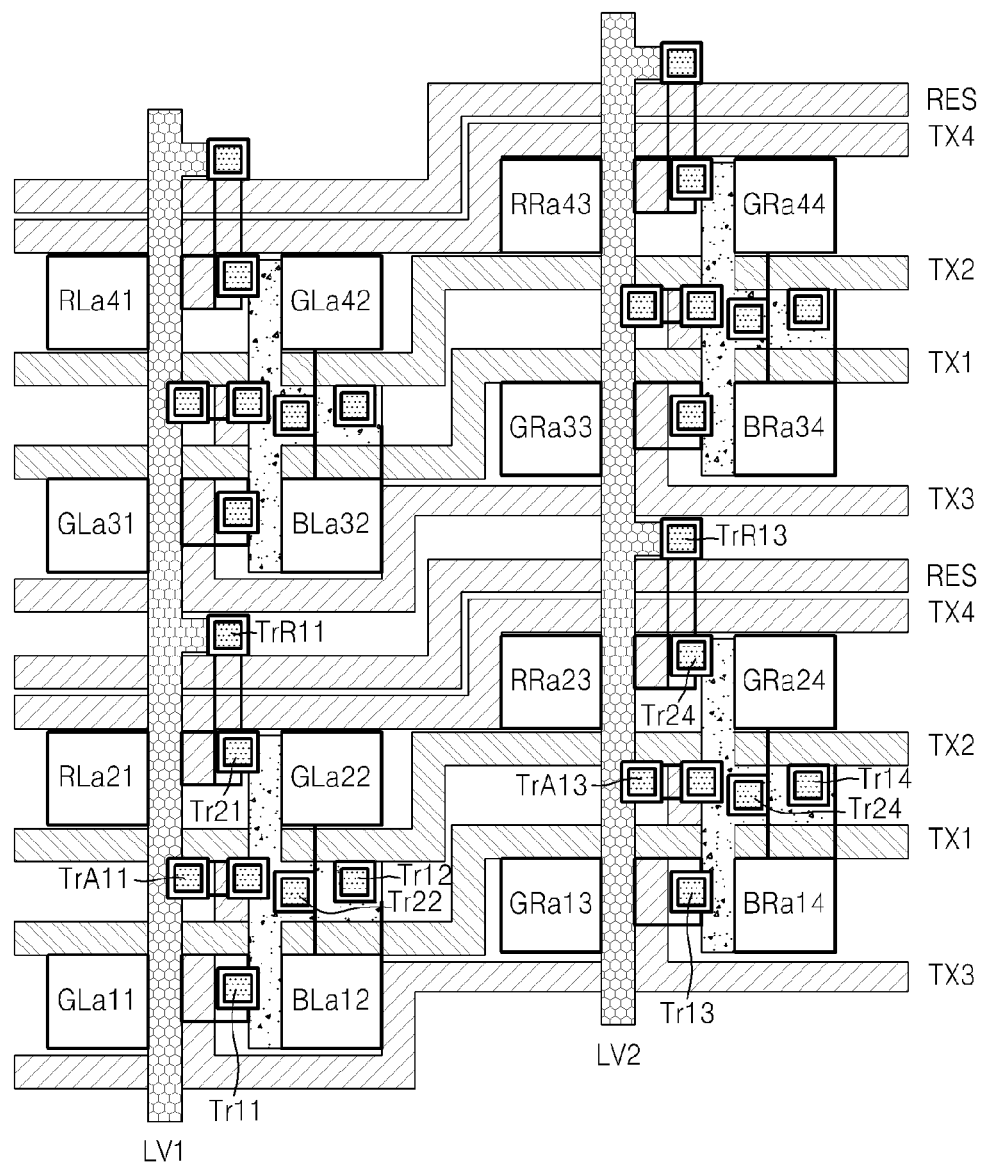
FIG. 20 is a circuit plan view of an example of an imaging device according to another embodiment of the invention.

FIG. 20 is a circuit plan view of an imaging device according to another embodiment of the invention. FIG. 20 illustrates the VA configuration illustrated in FIG. 10 for detecting vertical phase difference. In FIG. 20, as illustrated in FIG. 19, four pixels arranged in horizontal and vertical directions share a reset transistor and an amplification transistor. A structure of each of a plurality of pixels is the same as that in FIG. 19, except that, in L and R pixel series, transistor circuits and lines are positioned in the same direction with respect to photodiodes. For pixels to be configured as phase difference pixels, the L pixel series and the R pixel series are alternately arranged with respect to each other in a plane direction and a plurality of wire lines are wired corresponding thereto. In this embodiment, the four pixels arranged in horizontal and vertical directions share the amplification transistor and the reset transistor and thus sufficient wiring intervals are obtainable for each of units including four pixels. Although not illustrated in FIG. 20, the VA configuration of FIG. 20 may be repeatedly arranged on left and right sides thereof. In other words, the configuration of FIG. 10 may be repeatedly arranged. The same design also applies to pixels arranged in a horizontal direction.

Figure 21:
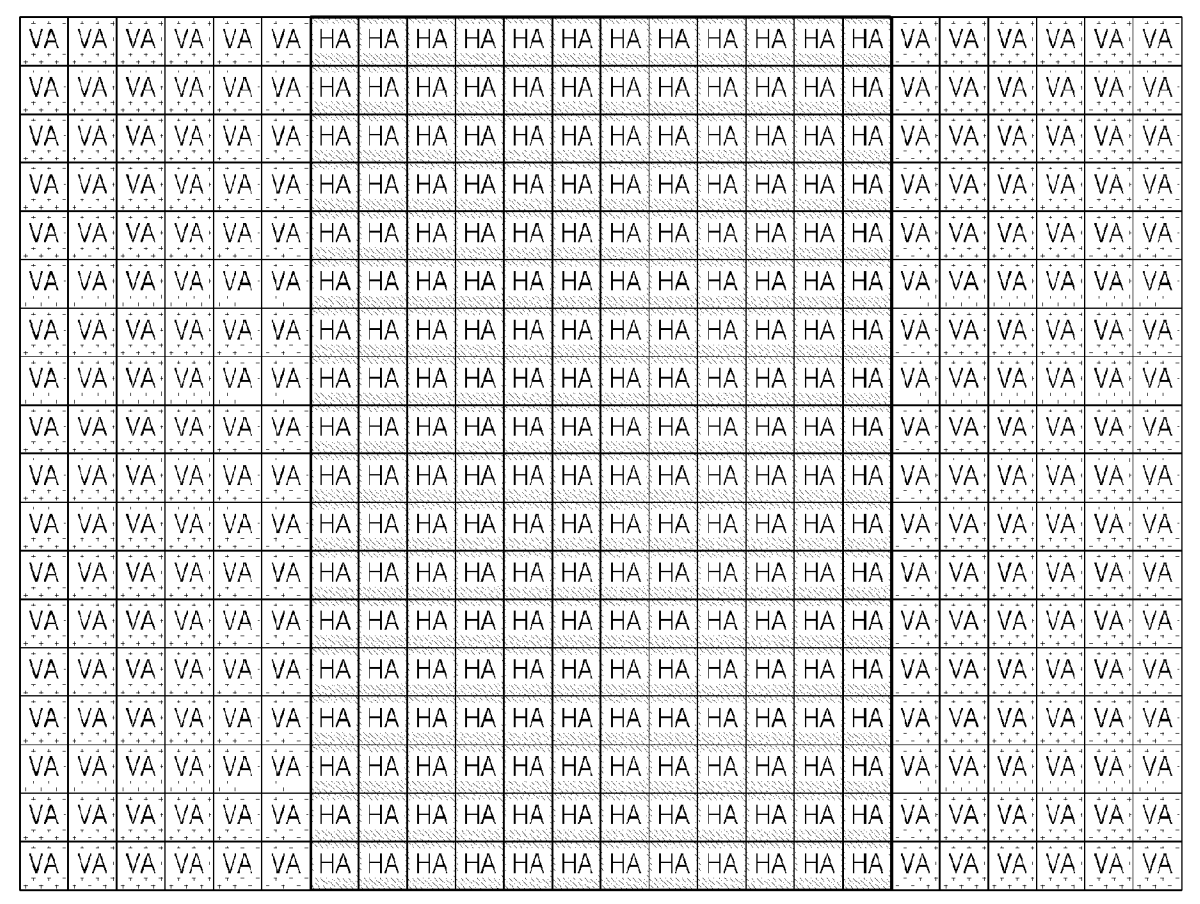

FIG. 21 illustrates an example of an imaging device in which a plurality of different phase difference pixels are configured, according to an embodiment of the invention. Actually, an imaging device may be, for example, a 14.6 mega pixel imaging device having a pixel configuration in which 4670 pixels are arranged in a horizontal direction and 3100 pixels are arranged in a vertical direction. In this embodiment, however, smaller pixel dimensions are arranged for explanation in diagram form. Referring to FIG. 21, the imaging device includes HAs and VAs. Pixels in which horizontal phase difference is detectable, e.g., the pixels having the HA configuration of FIG. 19, are arranged in the vicinity of an optical axis and pixels in which vertical phase difference is detectable, e.g., the pixels having the VA configuration of FIG. 20, are arranged on left and right sides of an area in which the HAs are arranged. Focal point detection by phase difference may be performed with respect to an entire screen area. In addition, contrast AF may be performed with respect to an entire screen area by using pixel information.

Figure 22:
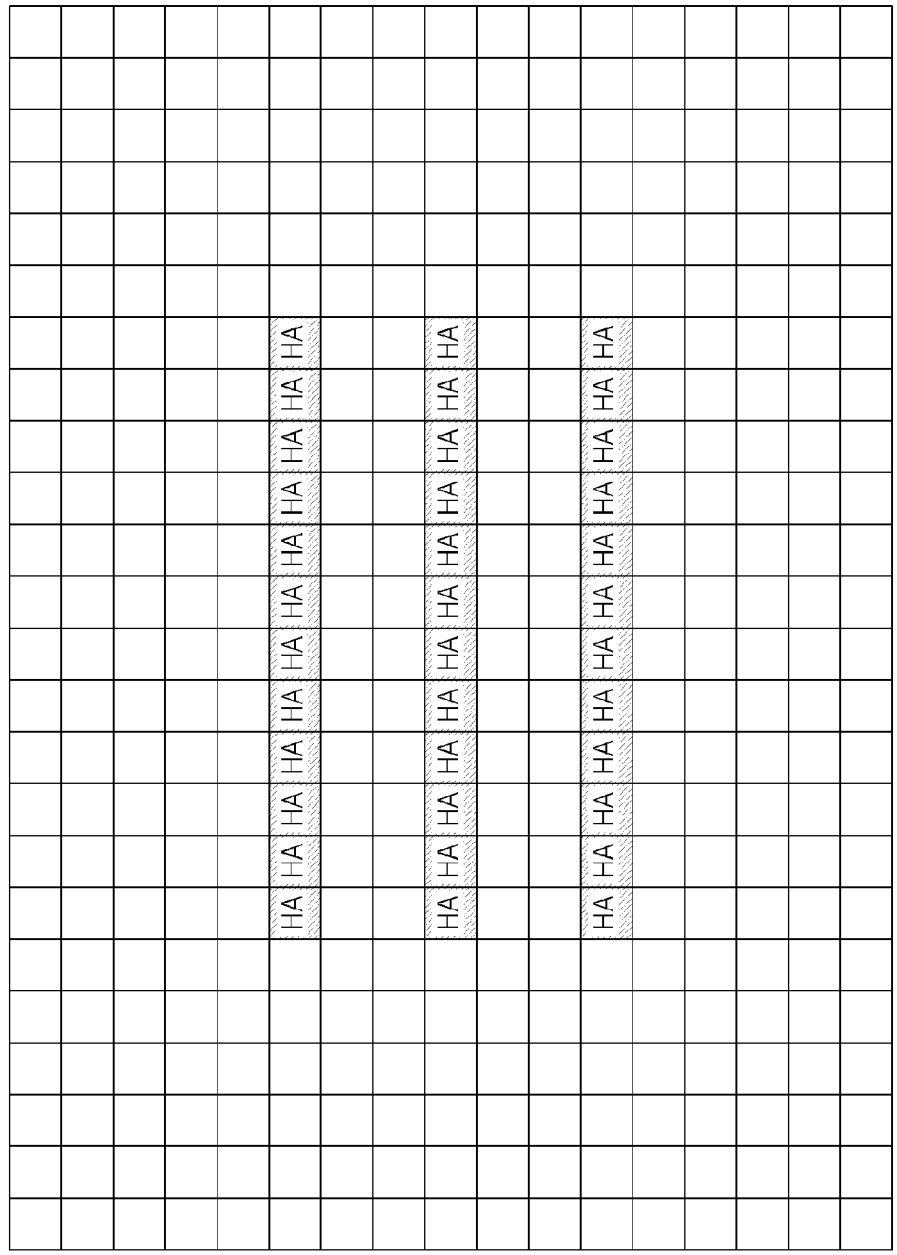
FIG. 22 illustrates an example of an imaging device in which general imaging pixels and phase difference pixels are configured, according to an embodiment of the invention.

FIG. 22 illustrates an example of an imaging device in which general imaging pixels and phase difference pixels are configured, according to an embodiment of the invention.

In this embodiment, smaller pixel dimensions are arranged for explanation in diagram form as illustrated in FIG. 21. Referring to FIG. 22, HAs having the phase difference pixel configuration of FIG. 17 are arranged around a center area in three lines and the general imaging pixels of FIG. 16 are arranged in remaining areas. In this regard, the HAs are arranged only on the center area to enable phase difference detection by using a lens with a low F number, according to identical conditions for phase difference detection. Similar to this embodiment, a configuration other than a configuration for phase difference detection with respect to entire screen areas is possible. In the imaging device of FIG. 22, arrangement of circuits is changed only for phase difference pixels.

As described above, according to the one or more embodiments of the invention, phase difference detection may be performed with respect to entire photographed screen areas. In addition, an imaging device including phase difference detection pixels has no defect pixels and thus it may obtain good image quality. Photographing and AF of a subject may be performed even in low luminance.

In embodiments, the invention provides an imaging device that maintains the same aperture ratio for all of pixels thereof, is capable of detecting phase difference from all the pixels by changing positions of openings through arrangement of circuits installed in pixels, and is capable of capturing an image of a subject and performing AF on a subject in low luminance.

The particular implementations shown and described herein are illustrative examples of the invention and are not intended to otherwise limit the scope of the invention in any way. For the sake of brevity, conventional electronics, control systems, software, and other functional aspects of the systems may not be described in detail. Furthermore, the connecting lines or connectors shown in the various figures presented are intended to represent exemplary functional relationships and/or physical or logical couplings between the various elements. It should be noted that many alternative or additional functional relationships, physical connections, or logical connections may be present in a practical device. Moreover, no item or component is essential to the practice of the invention unless the element is specifically described as "essential" or "critical."

The use of the terms "a" and "an" and "the" and similar referents in the context of describing the invention (especially in the context of the following claims) should be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein are performable in any suitable order unless otherwise indicated herein or otherwise clearly contradicted by context. The use of any and all examples or exemplary language (e.g., "such as") provided herein, is intended merely to better illuminate the invention and does not pose a limitation on the scope of the invention unless otherwise claimed. Moreover, it is well understood by one of ordinary skill in the art that numerous modifications, adaptations, and changes may be made under design conditions and factors without departing from the spirit and scope of the invention as defined by the following claims and within the range of equivalents thereof.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. An imaging device comprising:
    a plurality of pixels that are two-dimensionally arranged to capture an image and to detect phase difference, each of the plurality of pixels is configured to detect phase difference;
    a first photoelectric conversion pixel row; and
    a second photoelectric conversion pixel row,
    wherein circuits for phase difference detection formed in each of the pixels of the first pixel row are each disposed eccentrically in a first direction with respect to a pixel opening, and
    wherein circuits for phase difference detection formed in each of the pixels of the second pixel row are each disposed eccentrically in a second direction with respect to a pixel opening such that the eccentric disposition of the circuits in the second pixel row is opposite to the eccentric disposition of the circuits in the first pixel row.

2. The imaging device of claim 1, wherein all pixels of the imaging device output a signal for obtaining phase difference.

3. The imaging device of claim 1, wherein the first photoelectric conversion pixel row and the second photoelectric conversion pixel row each comprise a transistor circuit formed in each of a plurality of photoelectric conversion pixels, wherein the plurality of photoelectric conversion pixels share an amplification circuit or a reset circuit in the transistor circuit.

4. The imaging device of claim 1, wherein the circuits formed for each of a plurality of pixels for phase difference detection comprise at least one selected from the group consisting of a transmission circuit, a reset circuit, an amplification circuit, and a wiring circuit.

5. The imaging device of claim 1, wherein the first photoelectric conversion pixel row and the second photoelectric conversion pixel row are each disposed such that a micro lens is formed on each of the plurality of photoelectric conversion pixels and an opening is formed between the micro lens and a photoelectric conversion unit, wherein the opening is eccentrically formed with respect to an optical axis of the micro lens, wherein the first photoelectric conversion pixel row and the second photoelectric conversion pixel row are in directions opposite to each other.

6. The imaging device of claim 1, wherein the first photoelectric conversion pixel row and the second photoelectric conversion pixel row are each disposed such that a mask is formed in an area other than areas in which the plurality of photoelectric conversion pixels are formed.

7. The imaging device of claim 1, wherein pixels constituting each of the first photoelectric conversion pixel row and the second photoelectric conversion pixel row are formed of color filters, wherein the pixels are configured in a Bayer pattern to form Bayer pattern pixel units, wherein the Bayer pattern pixel units constitute each of the first photoelectric conversion pixel row and the second photoelectric conversion pixel row.

8. An imaging device comprising:
    a plurality of pixels that are two-dimensionally arranged to capture an image and to detect phase difference, each of the plurality of pixels is configured to detect phase difference;
    a first photoelectric conversion pixel row; and
    a second photoelectric conversion pixel row,
    wherein the first photoelectric conversion pixel row and the second photoelectric conversion pixel row are each disposed such that a circuit formed in every four pixels arranged in a Bayer pattern is positioned in a phase difference detection direction,
    wherein circuits for phase difference detection formed in each of the pixels of the first pixel row are each disposed eccentrically in a first direction with respect to a pixel opening, and
    wherein circuits for phase difference detection formed in each of the pixels of the second pixel row are each disposed eccentrically in a second direction with respect to a pixel opening such that the eccentric disposition of the circuits in the second pixel row is opposite to the eccentric disposition of the circuits in the first pixel row.

9. The imaging device of claim 8, wherein the first photoelectric conversion pixel row and the second photoelectric conversion pixel row are each disposed such that a mask is formed in an area other than areas in which the plurality of photoelectric conversion pixels are formed.

10. An imaging device comprising:
    a plurality of pixels that are two-dimensionally arranged to capture an image and detect phase difference, each of the plurality of pixels is configured to detect phase difference;
    a first photoelectric conversion pixel row; and
    a second photoelectric conversion pixel row, wherein a circuit formed in every four pixels arranged in a Bayer pattern is positioned in a phase difference detection direction, wherein circuits for phase difference detection formed in each of the pixels of the first pixel row are each disposed eccentrically in a first direction with respect to a pixel opening, and wherein circuits for phase difference detection formed in each of the pixels of the second pixel row are each disposed eccentrically in a second direction with respect to a pixel opening such that the eccentric disposition of the circuits in the second pixel row is opposite to the eccentric disposition of the circuits in the first pixel row.

11. The imaging device of claim 10, wherein the first photoelectric conversion pixel row and the second photoelectric conversion pixel row are each disposed such that a mask is formed in an area other than areas in which the plurality of photoelectric conversion pixels are formed.

12. An imaging device comprising:

a plurality of pixels that are two-dimensionally arranged to capture an image and to detect phase difference, each of the plurality of pixels is configured to detect phase difference;

a first photoelectric conversion pixel row; and a second photoelectric conversion pixel row, wherein a plurality of the photoelectric conversion pixels share an amplification circuit or a reset circuit of a transistor circuit formed in each of the plurality of the photoelectric conversion pixel, and wherein circuits for phase difference detection formed in each of the pixels of the first pixel row are each disposed eccentrically in a first direction with respect to a pixel opening, and wherein circuits for phase difference detection formed in each of the pixels of the second pixel row are each disposed eccentrically in a second direction with respect to a pixel opening such that the eccentric disposition of the circuits in the second pixel row is opposite to the eccentric disposition of the circuits in the first pixel row.

13. The imaging device of claim 12, wherein the first photoelectric conversion pixel row and the second photoelectric conversion pixel row are each disposed such that a mask is formed in an area other than areas in which the plurality of photoelectric conversion pixels are formed.

14. An imaging device comprising:

a plurality of pixels that are two-dimensionally arranged to capture an image and to detect phase difference, each of the plurality of pixels is configured to detect phase difference;

a first photoelectric conversion pixel row; and a second photoelectric conversion pixel row, wherein circuits for phase difference detection formed in each of the pixels of the first pixel row are each disposed eccentrically in a first direction with respect to a pixel opening, and wherein circuits for phase difference detection formed in each of the pixels of the second pixel row are each disposed eccentrically in a second direction with respect to a pixel opening such that the eccentric disposition of the circuits in the second pixel row is opposite to the eccentric disposition of the circuits in the first pixel row, and circuits formed in every pixel that does not perform phase difference detection are arranged in the same direction with respect to openings of the pixels.

15. The imaging device of claim 14, wherein the first photoelectric conversion pixel row and the second photoelectric conversion pixel row are each disposed such that a micro lens is formed on each of the plurality of pixels, wherein an opening is formed between the micro lens and a photoelectric conversion unit, wherein the opening is eccentrically formed with respect to an optical axis of the micro lens, wherein the first photoelectric conversion pixel row and the second photoelectric conversion pixel row are in directions opposite to each other.

* * * * *